United States Patent
Nakayama et al.

(10) Patent No.: US 10,173,421 B2
(45) Date of Patent: Jan. 8, 2019

(54) PIEZOELECTRIC ELEMENT, LIQUID EJECTING HEAD, AND PIEZOELECTRIC DEVICE

(71) Applicant: SEIKO EPSON CORPORATION, Tokyo (JP)

(72) Inventors: Masao Nakayama, Shiojiri (JP); Eiju Hirai, Azumino (JP); Naoto Yokoyama, Matsumoto (JP); Motoki Takabe, Shiojiri (JP); Toshihiro Shimizu, Fujimi-machi (JP)

(73) Assignee: Seiko Epson Corporation, Tokyo (JP)

( * ) Notice: Subject to any disclaimer, the term of this patent is extended or adjusted under 35 U.S.C. 154(b) by 37 days.

(21) Appl. No.: 15/278,673

(22) Filed: Sep. 28, 2016

(65) Prior Publication Data
US 2017/0096006 A1    Apr. 6, 2017

(30) Foreign Application Priority Data

Oct. 1, 2015   (JP) ................. 2015-196209

(51) Int. Cl.
*B41J 2/14*   (2006.01)
*H01L 41/047*   (2006.01)
(Continued)

(52) U.S. Cl.
CPC ....... *B41J 2/14209* (2013.01); *B41J 2/14233* (2013.01); *B41J 2/161* (2013.01); *B41J 2/1623* (2013.01); *B41J 2/1628* (2013.01); *B41J 2/1629* (2013.01); *B41J 2/1631* (2013.01); *B41J 2/1632* (2013.01); *B41J 2/1634* (2013.01); *B41J 2/1642* (2013.01); *B41J 2/1646* (2013.01); *H01L 41/0471* (2013.01); *H01L 41/0472* (2013.01); *H01L 41/0477* (2013.01);
(Continued)

(58) Field of Classification Search
CPC ............... B41J 2/14209; B41J 2/14201; B41J 2002/14217; H01L 41/0478; H01L 41/0805; H01L 41/0471; H01L 41/0477; H01L 41/1876; H01L 41/314; H01L 41/0472
See application file for complete search history.

(56) References Cited

U.S. PATENT DOCUMENTS 6,440,752 B1 *  8/2002  Zhang ............... H01L 21/31683
                                                257/E21.009
7,120,978 B2 * 10/2006  Wasa ....................... B41J 2/161
                                                252/62.9 PZ
(Continued)

FOREIGN PATENT DOCUMENTS

JP         10-264384 A    10/1998
JP         2014-112646 A  6/2014

*Primary Examiner* — Julian D Huffman
*Assistant Examiner* — Michael Konczal
(74) *Attorney, Agent, or Firm* — Foley & Lardner LLP

(57) ABSTRACT

Provided is a piezoelectric element including: a first electrode; a piezoelectric layer which is provided over the first electrode; and a second electrode provided on a side of the piezoelectric layer opposite to the first electrode, in which the second electrode includes a first layer which is provided on the piezoelectric layer side, and a second layer which is provided on a side of the first layer opposite to the piezoelectric layer, and the second layer does not contain platinum and covers an end portion of the first layer.

20 Claims, 12 Drawing Sheets

(51) Int. Cl.
*H01L 41/08* (2006.01)
*H01L 41/187* (2006.01)
*H01L 41/314* (2013.01)
*B41J 2/16* (2006.01)
*H01L 41/319* (2013.01)
*H01L 41/332* (2013.01)

(52) U.S. Cl.
CPC ...... *H01L 41/0478* (2013.01); *H01L 41/0805* (2013.01); *H01L 41/0815* (2013.01); *H01L 41/1876* (2013.01); *H01L 41/314* (2013.01); *H01L 41/319* (2013.01); *H01L 41/332* (2013.01); *B41J 2002/14241* (2013.01); *B41J 2002/14419* (2013.01); *B41J 2002/14491* (2013.01)

(56) References Cited

U.S. PATENT DOCUMENTS

| | | | |
|---|---|---|---|
| 2011/0234704 A1* | 9/2011 | Hahiro | B41J 2/14233 347/68 |
| 2012/0236084 A1* | 9/2012 | Watanabe | B41J 2/14233 347/71 |
| 2014/0132676 A1 | 5/2014 | Yazaki | |
| 2014/0253641 A1* | 9/2014 | Furuya | B41J 2/14201 347/71 |
| 2015/0295159 A1* | 10/2015 | Wada | G02B 26/0858 310/365 |

* cited by examiner

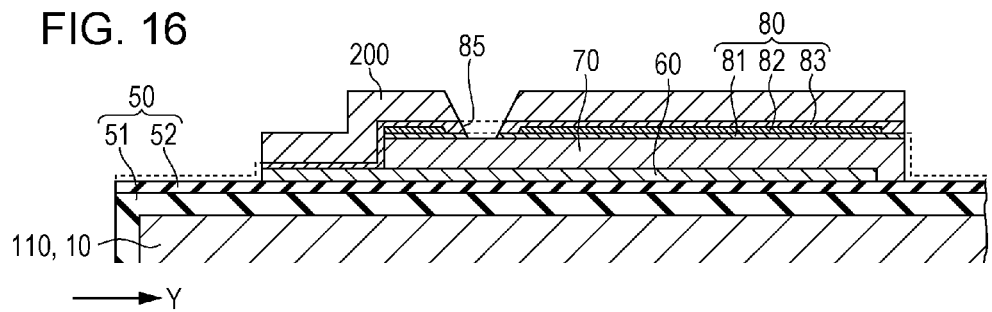
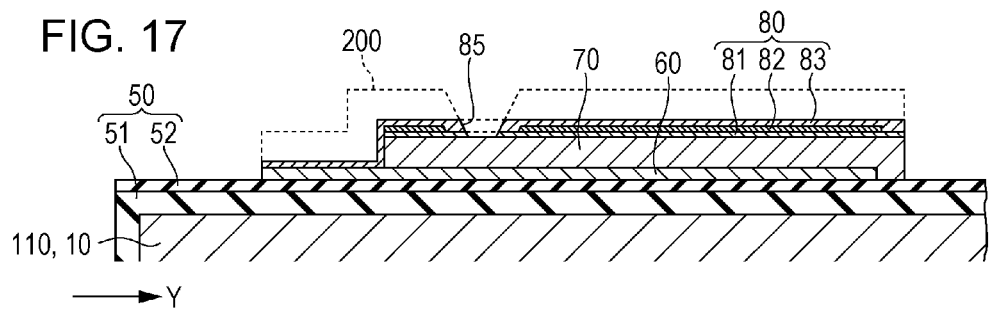
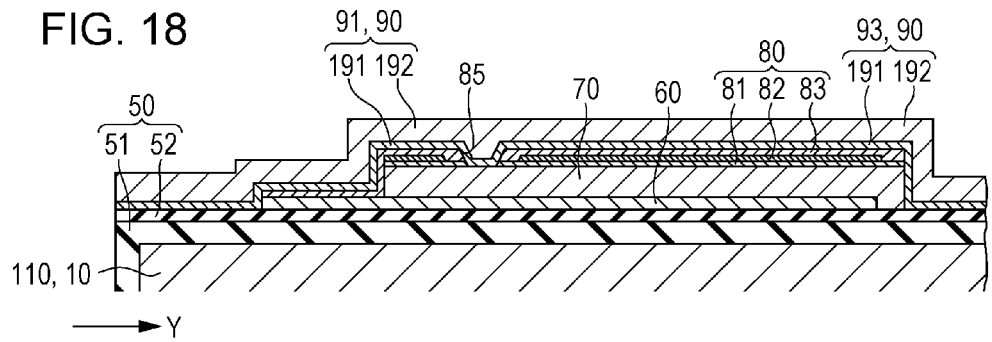
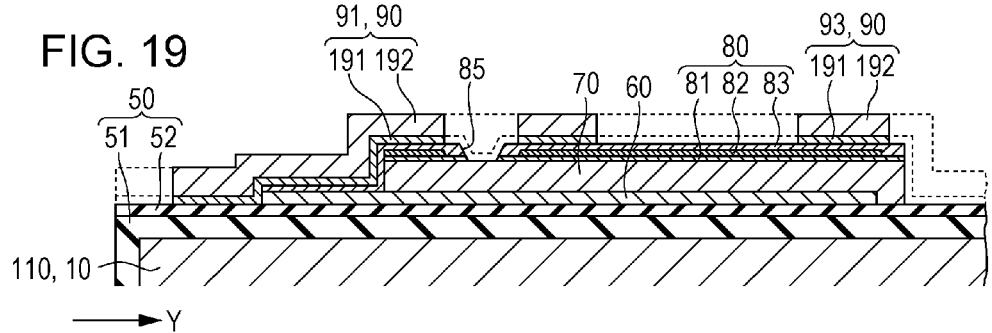

PIEZOELECTRIC ELEMENT, LIQUID EJECTING HEAD, AND PIEZOELECTRIC DEVICE

BACKGROUND

1. Technical Field

The present invention relates to a piezoelectric element including a first electrode, a piezoelectric layer, and a second electrode, a liquid ejecting head equipped with a piezoelectric element, and a piezoelectric device equipped with a piezoelectric element.

2. Related Art

A liquid ejecting head which ejects liquid droplets from nozzle openings communicating with pressure generation chambers by deforming a piezoelectric element to cause pressure fluctuation in a liquid in the pressure generation chamber is known. As a representative example of this liquid ejecting head, an ink jet type recording head which ejects ink droplets as liquid droplets is used.

An ink jet type recording head, for example, includes a piezoelectric element on one surface side of a flow path formation substrate where pressure generation chambers communicating with nozzle openings are provided, and ejects ink droplets from the nozzle openings by deforming a vibrating plate by driving the piezoelectric element to cause a pressure change in ink in the pressure generation chambers.

Here, the piezoelectric element includes a first electrode, a piezoelectric layer, and a second electrode provided on a substrate. A piezoelectric element using a material obtained by stacking iridium and iridium oxide as a second electrode, or a piezoelectric element which repairs damage when forming a second electrode on a piezoelectric layer by stacking iridium and titanium as a second electrode and performing an annealing treatment has been proposed (see JP-A-10-264384 and JP-A-2014-112646).

However, in a case where a material obtained by stacking iridium and iridium oxide as a second electrode is used as in JP-A-10-264384, damage to a piezoelectric layer when forming iridium oxide may not be repaired. When an annealing treatment is performed in order to repair the damage on the piezoelectric layer, the second electrode may be oxidized and contracted and may have an island shape, and thus, the second electrode may not function as an electrode.

As in JP-A-2014-112646, it is possible to repair damage to the piezoelectric layer by stacking iridium and titanium as a second electrode and performing an annealing treatment, however, electric resistance may increase due to oxidization of titanium, and the strength of an electric field capable of being applied to the piezoelectric layer may decrease.

Such problems are not limited to a piezoelectric element used in a liquid ejecting head of which an ink jet type recording head is representative, and a piezoelectric element used in other piezoelectric devices has the same problems.

SUMMARY

An advantage of some aspects of the invention is that a piezoelectric element, a liquid ejecting head, and a piezoelectric device having excellent piezoelectric characteristics are provided.

According to an aspect of the invention, there is provided a piezoelectric element including: a first electrode; a piezoelectric layer which is provided over the first electrode; and a second electrode provided on a side of the piezoelectric layer opposite to the first electrode, in which the second electrode includes a first layer which is provided on the piezoelectric layer side, and a second layer which is provided on a side of the first layer opposite to the piezoelectric layer, and the second layer does not contain platinum and covers an end portion of the first layer.

In this case, the first layer is not exposed to the surface by covering the end portion of the first layer with the second layer. Accordingly, since the first layer does not come into contact with water or hydrogen after forming the second layer, it is possible to use platinum which becomes a catalyst as the first layer. By using platinum as the first layer as described above, it is possible to improve piezoelectric characteristics by performing a re-heating treatment of the piezoelectric layer after forming the first layer, and it is possible to prevent a decrease in the strength of an electric field applied to the piezoelectric layer due to an increase in an electric resistance value due to the oxidization of the first layer, because the first layer is not oxidized by performing the re-heating treatment.

In the piezoelectric element according to the aspect of the invention, it is preferable that the first layer contain platinum. According to this, by using platinum as the first layer, it is possible to improve piezoelectric characteristics by performing a re-heating treatment of the piezoelectric layer after forming the first layer, and it is possible to prevent a decrease in the strength of an electric field applied to the piezoelectric layer due to an increase in an electric resistance value due to the oxidization of the first layer, because the first layer is not oxidized by performing the re-heating treatment.

In the piezoelectric element according to the aspect of the invention, it is preferable that the piezoelectric layer include a plurality of active portions interposed between both of the first electrode and the second electrode, the first electrode be provided for each active portion as an individual electrode, and the second electrode be a common electrode for the plurality of active portions. According to this, even when the second electrode is not covered with an insulating protection film, it is possible to prevent breakage of the first electrode and the second electrode due to the leakage. Since the second electrode is not covered with a protective film, even when the second layer is exposed, it is possible to prevent a reaction with water or hydrogen, because the second layer does not contain platinum.

In the piezoelectric element according to the aspect of the invention, it is preferable that the second electrode further includes a base layer containing an oxide between the first layer and the piezoelectric layer. According to this, it is possible to improve adhesiveness between the piezoelectric layer and the first layer by using the base layer and to improve reliability.

In the piezoelectric element according to the aspect of the invention, it is preferable that the end portion of the base layer and the second layer be provided so as to be in contact with each other, and a portion of the second layer in contact with the base layer be oxidized. According to this, by oxidizing the portion of the second layer in contact with the base layer, it is possible to increase an electric resistance value of the oxidized portion to decrease the strength of an electric field applied to the piezoelectric layer, and it is possible to prevent breakage due to stress concentration by decreasing the strength of an electric field in a boundary portion between an active portion and a non-active portion.

In the piezoelectric element according to the aspect of the invention, it is preferable that the piezoelectric layer include a groove that opens to the outer side of the first layer and the surface side where the first layer is provided, and the second layer extend to the side surface of the groove. According to this, since a boundary portion between an active portion and a non-active portion is not damaged due to hydrogen, it is possible to improve reliability.

In the piezoelectric element according to the aspect of the invention, it is preferable that the portion of the second layer in contact with the piezoelectric layer is oxidized. According to this, it is possible to increase an electric resistance value of the portion of the second layer in contact with the piezoelectric layer so as to decrease the strength of an electric field applied to the piezoelectric layer, and it is possible to prevent breakage due to stress concentration by decreasing the strength of an electric field in a boundary portion between an active portion and a non-active portion.

According to another aspect of the invention, there is provided a liquid ejecting head including the piezoelectric element described above.

In this case, it is possible to realize a liquid ejecting head having improved piezoelectric characteristics and improved liquid ejecting characteristics.

According to still another aspect of the invention, there is provided a piezoelectric device including the piezoelectric element described above.

In this case, it is possible to realize a piezoelectric device having improved piezoelectric characteristics.

BRIEF DESCRIPTION OF THE DRAWINGS

The invention will be described with reference to the accompanying drawings, wherein like numbers reference like elements.

FIG. 16 is a sectional view showing a manufacturing method of the recording head according to Embodiment 1 of the invention.

FIG. 17 is a sectional view showing a manufacturing method of the recording head according to Embodiment 1 of the invention.

FIG. 18 is a sectional view showing a manufacturing method of the recording head according to Embodiment 1 of the invention.

FIG. 19 is a sectional view showing a manufacturing method of the recording head according to Embodiment 1 of the invention.

DESCRIPTION OF EXEMPLARY EMBODIMENTS

Hereinafter, embodiments of the invention will be described in detail with reference to the drawings.

Embodiment 1

Figure 1:
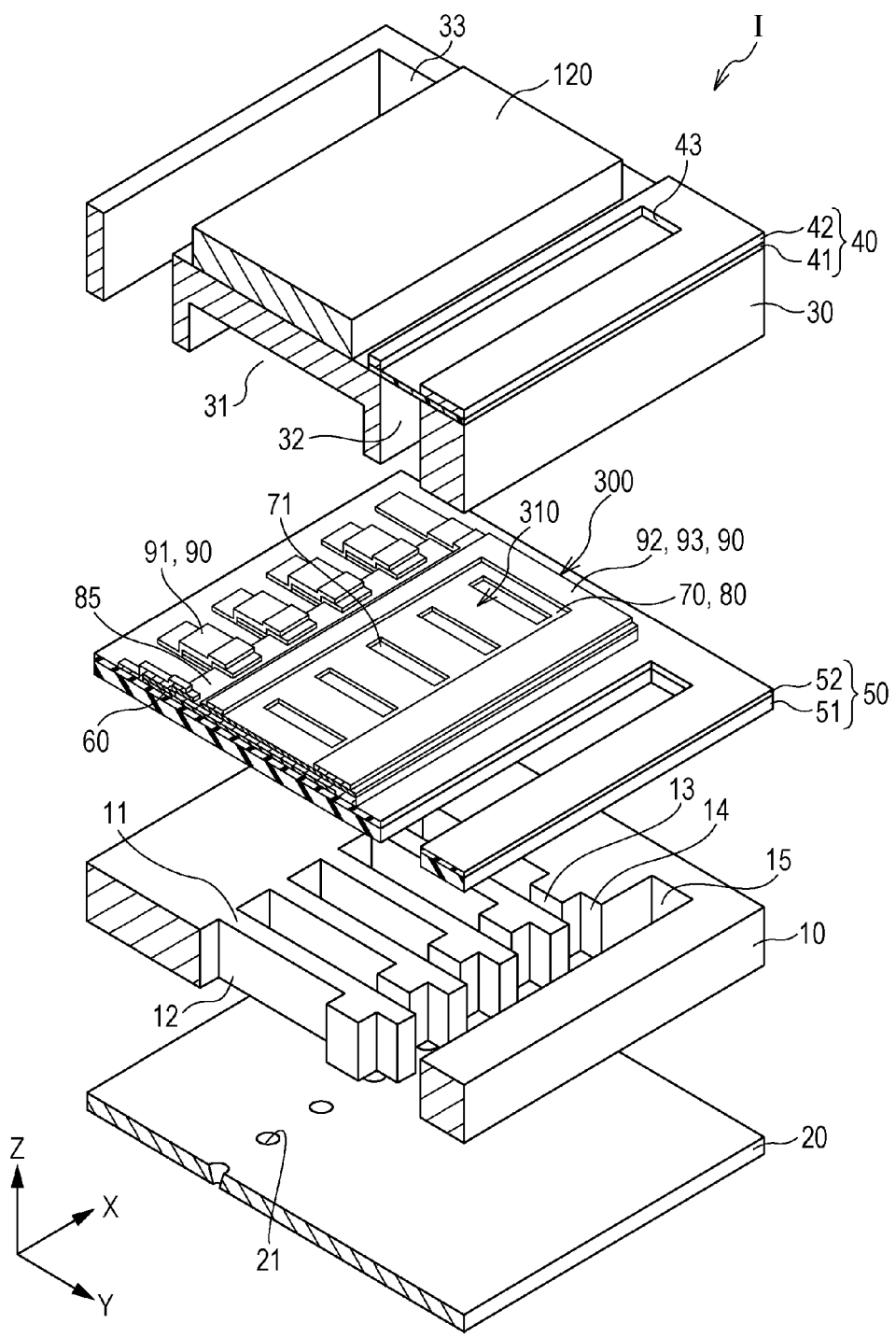
FIG. 1 is an exploded perspective view of a recording head according to Embodiment 1 of the invention.
Figure 2:
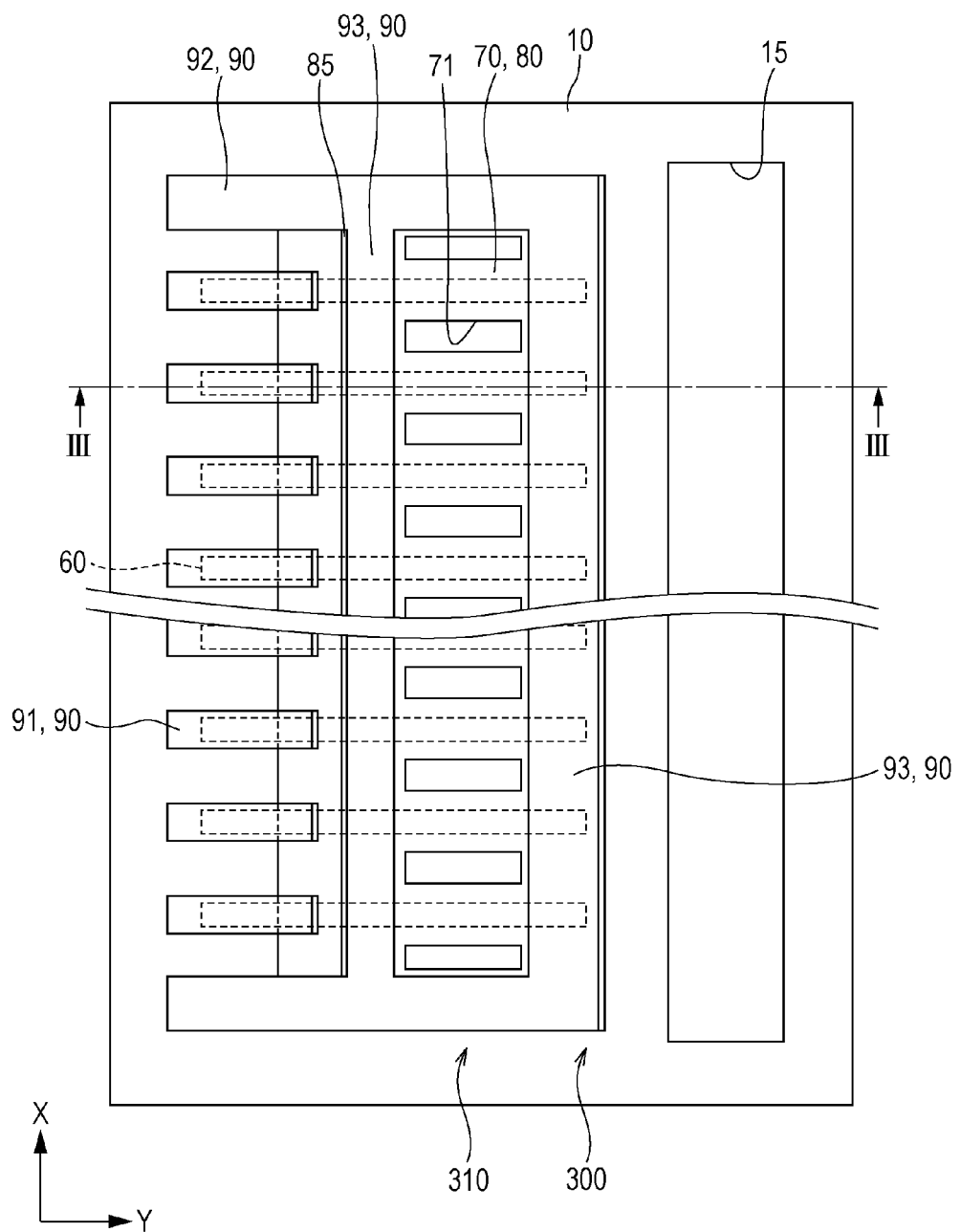
FIG. 2 is a plan view of a flow path formation substrate of the recording head according to Embodiment 1 of the invention.
Figure 3:
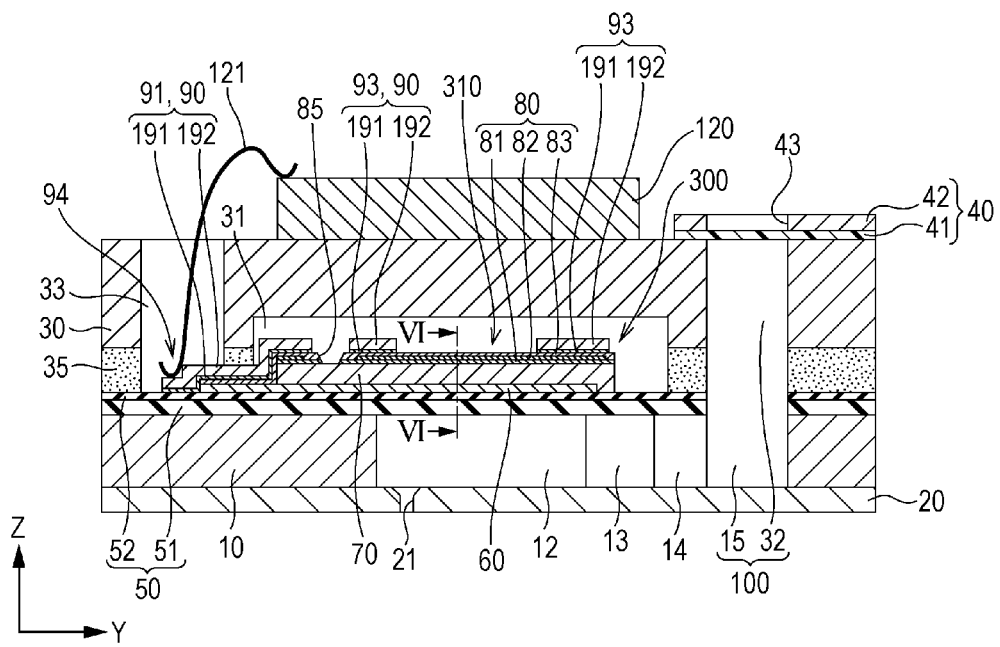
FIG. 3 is a sectional view of the recording head according to Embodiment 1 of the invention.
Figure 4:
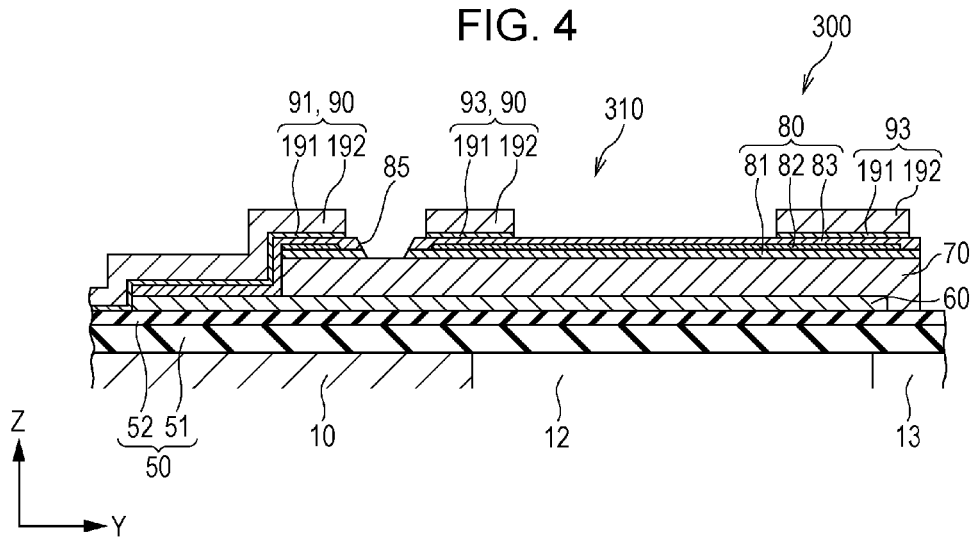
FIG. 4 is an enlarged sectional view of a main part of the recording head according to Embodiment 1 of the invention.
Figure 5:
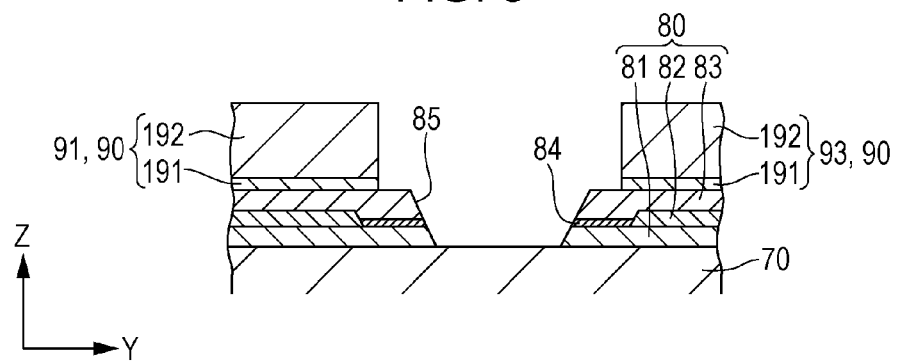
FIG. 5 is an enlarged sectional view of a main part of the recording head according to Embodiment 1 of the invention.
Figure 6:
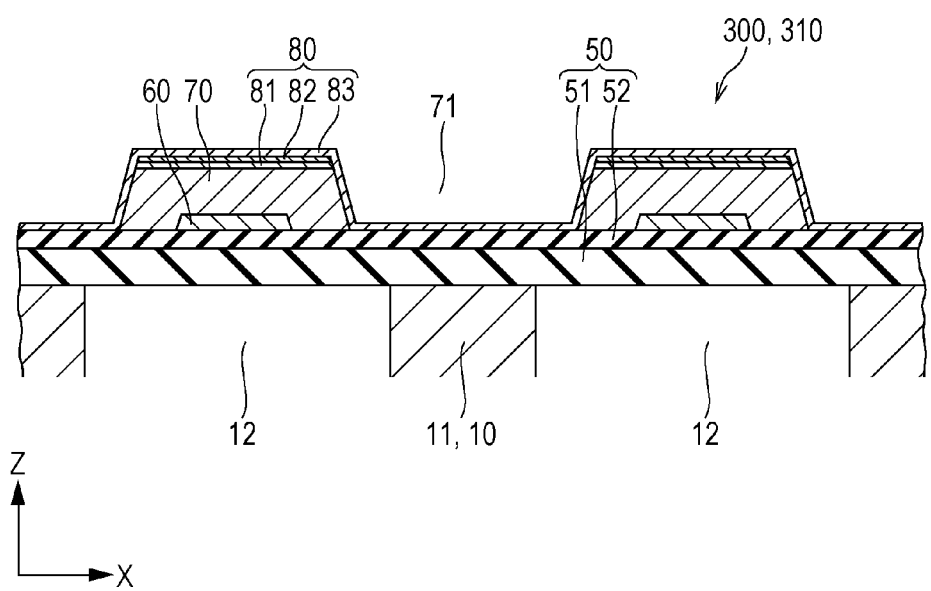
FIG. 6 is an enlarged sectional view of a main part of the recording head according to Embodiment 1 of the invention.

FIG. 1 is a perspective view of an ink jet type recording head which is an example of a liquid ejecting head according to Embodiment 1 of the invention, FIG. 2 is a plan view of a flow path formation substrate of the ink jet type recording head, FIG. 3 is a sectional view taken along a line III-III of FIG. 2, FIG. 4 and FIG. 5 are enlarged sectional views of a main part of FIG. 3, and FIG. 6 is a sectional view taken along a line VI-VI of FIG. 3.

As shown in the drawings, pressure generation chambers 12 are formed in a flow path formation substrate 10 which is a substrate of this embodiment included in an ink jet type recording head I which is an example of the liquid ejecting head of this embodiment. The pressure generation chambers 12 partitioned by a plurality of partition walls 11 are arranged in parallel in a direction in which a plurality of nozzle openings 21 discharging ink having the same color are arranged in parallel. Hereinafter, this direction is referred to as a parallel arrangement direction of the pressure generation chambers 12 or a first direction X. Hereinafter, a direction orthogonal to the first direction X is referred to as a second direction Y. In addition, a direction orthogonal to both of the first direction X and the second direction Y is, hereinafter, referred to as a third direction Z.

Ink supply paths 13 and communication paths 14 are partitioned by the plurality of partition walls 11 on one end portion side of the pressure generation chambers 12 of the flow path formation substrate 10 in a longitudinal direction, that is, on one end portion side in the second direction Y orthogonal to the first direction X. A communication portion 15 forming a part of a manifold 100 which is a common ink chamber of the pressure generation chambers 12 is formed on an outer side of the communication paths 14 (on a side opposite to the pressure generation chambers 12 in the second direction Y). That is, liquid flow paths formed of the pressure generation chambers 12, the ink supply paths 13, the communication paths 14, and the communication portion 15 are provided in the flow path formation substrate 10.

A nozzle plate 20 through which the nozzle openings 21 communicating with the pressure generation chambers 12 penetrate is bonded to one surface side of the flow path formation substrate 10, that is, a surface to which the liquid flow paths of the pressure generation chambers 12 and the like open, by using an adhesive or a heat welding film. That is, the nozzle openings 21 are arranged in parallel in the first direction X in the nozzle plate 20.

A vibrating plate 50 is formed on a side of the other surface of the flow path formation substrate 10. The vibrating plate 50 according to this embodiment is formed of an elastic film 51 which is formed on the flow path formation substrate 10 and an insulating film 52 which is formed on the elastic film 51. The liquid flow paths of the pressure generation chambers 12 and the like are formed by performing anisotropic etching of the flow path formation substrate 10 from one surface thereof, and the other surface of the liquid flow paths of the pressure generation chamber 12 and the like is formed of the elastic film 51 of the vibrating plate 50.

A piezoelectric element 300 including first electrodes 60, a piezoelectric layer 70 provided over the first electrodes 60, and a second electrode 80 provided on a side opposite to the first electrodes 60 of the piezoelectric layer 70 is provided on the insulating film 52. In this embodiment, the flow path formation substrate 10 where the pressure generation chambers 12 are provided, the vibrating plate 50, and the piezoelectric element 300 form an actuator device which is an example of a piezoelectric device.

The first electrodes 60 forming the piezoelectric element 300 are divided among the pressure generation chambers 12 and form individual electrodes which are independently provided for active portions 310 which will be described later. Each of the first electrodes 60 is formed so as to have a narrower width than the width of the pressure generation chamber 12 in the second direction Y of the pressure generation chamber. That is, the end portion of the first electrode 60 in the first direction X of the pressure generation chamber 12 is positioned in an area opposing the pressure generation chamber 12. Both end portions of the first electrode 60 in the second direction Y extend to the outside of the pressure generation chamber 12. As a material of the first electrodes 60, a material which is not oxidized when forming the piezoelectric layer 70 which will be described later or maintains conductivity even when being oxidized is preferable, and for example, a noble metal such as platinum (Pt) or iridium (Ir), or a conductive oxide of which lanthanum nickel oxide (LNO) is representative is preferably used.

As for the first electrodes 60, an adhesive layer for ensuring adhesiveness may be used between the conductive material described above and the vibrating plate 50. In this embodiment, although not particularly shown, titanium is used as the adhesive layer. As the adhesive layer, zirconium, titanium, or titanium oxide may be used. That is, in this embodiment, the first electrodes 60 are formed with the adhesive layer formed of titanium and a conductive layer which is formed of at least one kind selected from the conductive materials described above.

The piezoelectric layer 70 is continuously provided along the first direction X, so as to have a predetermined width in the second direction Y. The width of the piezoelectric layer 70 in the second direction Y is wider than a length of the pressure generation chamber 12 in the second direction Y. Accordingly, in the second direction Y of the pressure generation chamber 12, the piezoelectric layer 70 is provided so as to extend to the outside of the pressure generation chamber 12.

In the second direction Y of the pressure generation chamber 12, an end portion of the piezoelectric layer 70 on an ink supply path side is positioned on an outer side with respect to the end portion of the first electrode 60. That is, the end portion of the first electrode 60 is covered with the piezoelectric layer 70. An end portion of the piezoelectric layer 70 on the nozzle openings 21 side is positioned on an inner side (the pressure generation chamber 12 side) with respect to the end portion of the first electrode 60, and the end portion of the first electrode 60 on the nozzle openings 21 side is not covered with the piezoelectric layer 70.

The piezoelectric layer 70 is a crystal film (perovskite type crystal) which is formed over the first electrodes 60 and has a perovskite structure formed of a ferroelectric ceramic material showing an electromechanical transduction operation. The piezoelectric layer 70 may be provided immediately above the first electrodes 60 or may be provided with other members interposed therebetween. That is, the term "over" includes the meaning of "immediately above" and a state where other members are interposed therebetween. As the material of the piezoelectric layer 70, a ferroelectric piezoelectric material such as lead zirconate titanate (PZT) or a material obtained by adding metal oxide such as niobium oxide, nickel oxide, or magnesium oxide to the ferroelectric piezoelectric material may be used. In addition, the material of the piezoelectric layer 70 is not limited to a lead-based piezoelectric material containing lead, and a lead-free piezoelectric material not containing lead may also be used.

As will be described later in detail, the piezoelectric layer 70 may be formed by using a liquid phase method such as a sol-gel method or a metal-organic decomposition (MOD) method, or a physical vapor deposition (PVD) method (gas phase method) such as a sputtering method or a laser ablation method.

Openings 71 having a recess shape which opens to a side opposite to the flow path formation substrate 10 so as to correspond to the partition walls 11 are formed on the piezoelectric layer 70. The openings 71 are provided so as to penetrate the piezoelectric layer 70 in the third direction Z which is a thickness direction. The width of the opening 71 in the first direction X is wider than the width of each of the partition walls 11 in the first direction. Accordingly, an increase in the rigidity of a portion of the vibrating plate 50 opposing the end portion of the pressure generation chamber 12 in the first direction X which is a so-called arm of the vibrating plate 50 is prevented, and thus, it is possible to favorably displace the piezoelectric element 300. That is, the piezoelectric layer 70 is basically not provided on the partition walls 11. In addition, on the end portions of the partition walls 11 in the second direction Y, the piezoelectric layer 70 may be formed on the partition walls 11. That is, the length of the opening 71 in the second direction Y may be longer than the length of the pressure generation chamber 12 and extend to the outside of the end portion of the pressure generation chamber 12, or may be shorter than the length of the pressure generation chamber 12 and provided further toward the inner side than the end portion of the pressure generation chamber 12.

The second electrode 80 is provided on a side of the piezoelectric layer 70 opposite to the first electrodes 60 and forms a common electrode which is used for all of a plurality of the active portions 310. The second electrode 80 may be provided over the piezoelectric layer 70, and may be provided immediately above the piezoelectric layer 70 or other members may be interposed therebetween. In this embodiment, as shown in FIG. 4 to FIG. 6, the second electrode 80 includes a base layer 81 which is provided on the piezoelectric layer 70, a first layer 82 which is provided on a side of the base layer 81 opposite to the piezoelectric layer 70, and a second layer 83 which is provided on a side of the first layer 82 opposite to the piezoelectric layer 70.

The base layer 81 is preferably formed of a conductive oxide, and iridium oxide or lanthanum nickel oxide (LNO) may be used. The base layer 81 may be a stack of a plurality of materials. In addition, the base layer 81 may be formed by using a physical vapor deposition (PVD) method (gas phase method) such as a sputtering method or a laser ablation method, or a liquid phase method such as a sol-gel method, a metal-organic decomposition (MOD) method, or a plating method. The base layer 81 is not necessary; however, it is possible to improve the reliability of the piezoelectric layer 70 by providing the base layer 81. In this embodiment, the base layer 81 having such a structure is substantially provided over the entire surface of the piezoelectric layer 70 on a side opposite to the first electrodes 60.

As the first layer 82, platinum (Pt) is preferably used. As long as the first layer 82 contains platinum (Pt), other materials may be contained. However, in the first layer 82, it is preferable that a material for which an electric resistance value does not significantly decrease upon heating is mainly used, and accordingly, platinum (Pt) is preferably used as a main component. In addition, the expression "the main component of the first layer 82 is platinum (Pt)" means that the content of platinum (Pt) contained in the first layer 82 is equal to or greater than 50% by mass and is preferably equal to or greater than 70% by mass.

In addition, the first layer 82 may be formed by using a physical vapor deposition (PVD) method (gas phase method) such as a sputtering method or a laser ablation method, or a liquid phase method such as a sol-gel method, a metal-organic decomposition (MOD) method, or a plating method. After forming the base layer 81 and the first layer 82, it is possible to improve characteristics of the piezoelectric layer 70 by performing heat treatment. That is, even when the piezoelectric layer 70 is damaged when forming the base layer 81 and the first layer 82, the damage to the piezoelectric layer 70 may be repaired by performing heat treatment and it is possible to improve the piezoelectric characteristics of the piezoelectric layer 70. Since the first layer 82 contains platinum, the first layer is not oxidized even when heat treatment for repairing damage to the piezoelectric layer 70 is performed, and it is possible to prevent an increase in an electric resistance value and thus prevent a decrease in an electric resistance value of the entirety of the second electrode 80. Therefore, it is possible to improve the displacement characteristics of the piezoelectric element 300, that is, obtain excellent piezoelectric characteristics with a low voltage, by preventing a decrease in field intensity applied to the piezoelectric layer 70 by the second electrode 80.

As the second layer 83, a material having conductivity and not containing platinum (Pt), for example, a metal material such as iridium (Ir), aluminum (Al), nickel (Ni), chromium (Cr), nickel chromium (NiCr), copper (Cu), palladium (Pd), gold (Au), tungsten (W), or titanium (Ti), or a conductive oxide of which lanthanum nickel oxide (LNO) is representative may be used. The material of the second layer 83 may be a single material composed of the metal material or may be a composite material obtained by mixing a plurality of materials. In addition, titanium or the like may be provided between the first layer 82 and the second layer 83. In this embodiment, a multi-layer electrode of iridium (Ir) and titanium (Ti) is used as the second layer 83. In addition, it is preferable that the second layer 83 be manufactured by a method not using hydrogen or water. The reason therefor is as follows. Since the second layer 83 is formed on the first layer 82, the first layer 82 is exposed when forming the second layer 83, and accordingly, platinum contained in the first layer 82 operates as a catalyst and hydrogen is generated. Therefore, the second layer 83 is preferably formed by a method other than the CVD method and is suitably formed by a sputtering method.

In this embodiment, the second layer 83 is continuously provided on the first layer 82, on the base layer 81 and on the side surface of the piezoelectric layer 70 where the first layer 82 is not provided, and on the first electrode 60. That is, the second layer 83 is provided on the side surface of the piezoelectric layer 70 exposed through the openings 71, on the vibrating plate 50 which forms a bottom surface of the openings 71, that is, the inner surface of the openings 71.

The second layer 83 on the first layer 82 and the second layer 83 on the first electrode 60 are electrically disconnected from each other through a removal portion 85. That is, the second layer 83 on the first layer 82 and the second layer 83 on the first electrode 60 are on the same layer but are formed so as to be electrically discontinuous from each other. Herein, the removal portion 85 is provided on the piezoelectric layer 70 on the nozzle openings 21 side, and penetrates the second electrode 80, that is, the base layer 81, the first layer 82, and the second layer 83 in the third direction Z which is a thickness direction so as to perform electrical disconnection. The removal portion 85 having such a form is provided so as to penetrate the second electrode 80 in the third direction Z continuously along the first direction X. The end portion of the second electrode 80 cut by the removal portion 85 has a tapered shape in which the thickness in the third direction Z gradually decreases toward the end portion.

Here, the second layer 83 extends to the outside of the end portion of the first layer 82 and the second layer 83 covers the end portion of the first layer 82. The expression the second layer 83 covers the end portion of the first layer 82" means that the second layer 83 extends from the upper portion of one surface of the first layer 82 in the third direction Z to the upper portion of the end portion surface of the second layer 83. Accordingly, the first layer 82 is completely covered with the second layer 83 and the surface of the first layer 82 is not exposed.

In this embodiment, as shown in FIG. 6, the end portion of the first layer 82 in the first direction X is an edge of the opening of the opening 71 of the piezoelectric layer 70. As described above, since the second layer 83 is also provided on the side surface of the piezoelectric layer 70 exposed through the opening 71, the end portion of the first layer 82 in the first direction X is covered with the second layer 83.

The end portion of the first layer 82 in the second direction Y is formed closer to the inner side than the end portion of the base layer 81, that is, so as to be shorter than the base layer 81 in the second direction Y. Accordingly, the end portion of the first layer 82 in the second direction Y is covered with the second layer 83 by extending the second layer 83 to the same position as the end portion of the base layer 81 or to the outside of the base layer 81. In addition, as shown in FIG. 4 and FIG. 5, the end portions of the first layer 82 in the second direction Y are present at four portions in total, namely, the end portions where the removal portion 85 is provided and both end portions of the piezoelectric layer 70. Among these, in the three portions of both end portions of the first layer 82 formed by the removal portion 85 and the end portion of the first layer 82 on a side opposite to a side where the removal portion 85 is provided, the first layer 82 is formed to be shorter than the base layer 81 and is covered with the second layer 83 by forming the second layer 83 so as to have the same length as that of the base layer 81. The end portion of the first layer 82 on a side where the second layer 83 extends to the upper portion of the first electrode 60 is provided at the same position as the end portion of the base layer 81, and the end portion of the first layer 82 is covered with the second layer 83.

As described above, by completely covering the surface of the first layer 82 containing platinum with the second layer 83 so that the surface is not exposed, in the step after forming the second layer 83, it is possible to prevent platinum contained in the first layer 82 from operating as a catalyst and thus decrease damage to the piezoelectric layer 70 and prevent a decrease in the piezoelectric characteristics of the piezoelectric layer 70. In addition, in a case where the first layer 82 containing platinum is exposed, platinum becomes a catalyst and decomposes hydrogen or water in the later steps to generate hydrogen ions, and the piezoelectric layer 70 may become damaged. As described above, the piezoelectric characteristics of the piezoelectric layer 70 that is damaged may decrease.

A portion of the second layer 83 in contact with the base layer 81 is an oxidized portion 84 which is oxidized by oxygen contained in the base layer 81. The oxidized portion 84 is provided at the end portion of the active portion 310 defined by the removal portion 85 within the end portion of the second electrode 80, and accordingly, it is possible to increase an electric resistance value of the second electrode 80 on the end portion of the active portion 310. Accordingly, it is possible to reduce the electric field strength at the end portion of the active portion 310 by using the oxidized portion 84, and to prevent breakage of the piezoelectric layer 70 of the end portion of the active portion 310. Although not particularly shown, since the second layer 83 and the base layer 81 are in contact with each other in the second direction Y, even in the end portion of the second layer 83 on a side opposite to the removal portion 85, the oxidized portion 84 is formed in the contact portion.

In the piezoelectric element 300 formed of the first electrode 60, the piezoelectric layer 70, and the second electrode 80, displacement occurs by applying a voltage between the first electrode 60 and the second electrode 80. That is, by applying a voltage between both electrodes, a piezoelectric strain is generated in the piezoelectric layer 70 which is narrowed by the first electrode 60 and the second electrode 80. When the voltage is applied between both electrodes, a portion in which the piezoelectric strain is generated in the piezoelectric layer 70 is called the active portion 310. A portion in which the piezoelectric strain is not generated in the piezoelectric layer 70 is called a non-active portion. In the active portion 310 in which the piezoelectric strain is generated in the piezoelectric layer 70, a portion opposing the pressure generation chamber 12 is called a flexible portion and a portion outside of the pressure generation chamber 12 is called a non-flexible portion.

In this embodiment, in the second direction Y, all of the first electrode 60, the piezoelectric layer 70, and the second electrode 80 are provided to the outside of the pressure generation chamber 12 in a continuous form. That is, the active portion 310 is provided up to the outside of the pressure generation chamber 12 in a continuous form. Accordingly, within the active portion 310, a portion of the piezoelectric element 300 opposing the pressure generation chamber 12 is the flexible portion and a portion thereof outside of the pressure generation chamber 12 is the non-flexible portion.

That is, in this embodiment, as shown in FIG. 3 and FIG. 4, an end portion of the active portion 310 in the second direction Y is defined by the second electrode 80 where the removal portion 85 is provided. That is, in one end portion of the active portion 310, the first electrode 60 extends to the outside of the second electrode 80 in the second direction Y, and one end portion of the active portion 310 is defined by providing the end portion of the second electrode 80 at a position opposing the first electrode 60. In the second direction Y, the other end portion of the active portion 310 on a side opposite to the removal portion 85 is defined by the end portion of the first electrode 60.

The end portion of the active portion 310 in the first direction X is defined by the first electrode 60. The end portion of the first electrode 60 in the first direction X is provided in an area opposing the pressure generation chamber 12. Accordingly, the end portion of the active portion 310 in the first direction X is provided on the flexible portion, and, in the first direction X, stress on a boundary of the active portion 310 and the non-active portion is released due to deformation of the vibrating plate. Accordingly, it is possible to prevent breakage such as burnout or cracks due to stress concentration at the end portion of the active portion 310 in the first direction X.

In the piezoelectric element 300, since the second electrode 80 covers the piezoelectric layer 70, it is possible to prevent breakage of the piezoelectric element 300 without leakage of current between the first electrode 60 and the second electrode 80. In addition, when the first electrode 60 and the second electrode 80 are exposed when adjacent to each other, the current leaks to the surface of the piezoelectric layer 70 and the piezoelectric layer 70 breaks. If the distance between these is short, leakage of current does not occur, although the first electrode 60 and the second electrode 80 are exposed. Accordingly, an insulating protection film covering the piezoelectric element 300 is not necessary and it is possible to suppress a decrease in the displacement characteristics of the piezoelectric element 300 due to a protection film.

As shown in FIG. 3 and FIG. 4, an individual lead electrode 91 and a common lead electrode 92 which are wiring layers of this embodiment are connected to the first electrode 60 and the second electrode 80 of the piezoelectric element 300.

In this embodiment, the individual lead electrode 91 and the common lead electrode 92 (hereinafter, both of them will be collectively referred to as lead electrodes 90) are on the same layer, but are formed so as to be electrically discontinuous. In detail, the lead electrode 90 includes an adhesive layer 191 which is provided on the second layer 83 side of the second electrode 80 and a conductive layer 192 which is provided on the adhesive layer 191.

The adhesive layer 191 is for improving adhesiveness of the second layer 83, the vibrating plate 50, and the like with the conductive layer 192. As a material thereof, nickel (Ni), chromium (Cr), nickel chromium (NiCr), titanium (Ti), titanium tungsten (TiW) may be used, for example. The adhesive layer 191 may be formed by using the materials described above as a single material, may be formed of a composite material obtained by mixing the plurality of materials, or may be formed by stacking a plurality of layers having different materials. In this embodiment, nickel chromium (NiCr) is used as the adhesive layer 191.

A material of the conductive layer 192 is not particularly limited, as long as it is a material having comparatively high conductivity, and gold (Au), platinum (Pt), aluminum (Al), or copper (Cu) may be used, for example. In this embodiment, gold (Au) is used as the conductive layer 192.

Here, the individual lead electrode 91 is provided on the first electrode 60 which is provided on the outer side of the piezoelectric layer 70. In addition, a conductive layer which is formed of the same layer as the second layer 83 of the second electrode 80 as described above, but is provided discontinuously from the second layer 83, is provided on the first electrode 60. Accordingly, the first electrode 60 and the individual lead electrode 91 are electrically connected to each other through the conductive layer which is the same layer as the second layer 83 and is provided discontinuously from the second layer 83.

The common lead electrode 92 is provided on the second electrode 80 (on the second electrode 80 of the piezoelectric layer 70). As shown in FIG. 1 and FIG. 2, the common lead electrode 92 continues and leaves the upper portion of the vibrating plate 50 in the second direction Y, at both end portions of the flow path formation substrate 10 in the first direction X.

In the second direction Y, the common lead electrode 92 includes an extending portion 93 which is provided on the wall surface of the pressure generation chamber 12, that is, over the boundary portion of the flexible portion and the non-flexible portion. The extending portion 93 is continuously provided on the plurality of the active portions 310 along the first direction X, and continues to the common lead electrode 92 with both end portions in the first direction X. As described above, by providing the extending portion 93, it is possible to prevent breakage of the piezoelectric layer 70 due to the stress concentration on the boundary of the flexible portion and the non-flexible portion.

As shown in FIG. 3, a protection substrate 30 which protects the piezoelectric element 300 is bonded onto the flow path formation substrate 10 on which the piezoelectric element 300 is formed by using an adhesive 35. A piezoelectric element holding portion 31 which is a recess for partitioning a space for accommodating the piezoelectric element 300 is provided on the protection substrate 30. A manifold portion 32 forming a part of the manifold 100 is provided on the protection substrate 30. The manifold portion 32 penetrates the protection substrate 30 in the thickness direction so as to extend along a width direction of the pressure generation chamber 12, and communicates with the communication portion 15 of the flow path formation substrate 10 as described above. In addition, a penetration hole 33 which penetrates through the protection substrate 30 in the thickness direction is provided on the protection substrate 30. The lead electrode 90 connected to the first electrode 60 of each of the active portions 310 is exposed in the penetration hole 33, and one end portion of a connection wire connected to a driving circuit (not shown) is connected to the lead electrode 90 in the penetration hole 33.

A compliance substrate 40 formed of a sealing film 41 and a fixed plate 42 is bonded to the protection substrate 30. The sealing film 41 is formed of a flexible material having low rigidity, and one surface of the manifold portion 32 is sealed with this sealing film 41. In addition, the fixed plate 42 is formed of a hard material such as metal or the like. Since the area of the fixed plate 42 opposing the manifold 100 is set to an opening portion 43 which is completely removed in the thickness direction, one surface of the manifold 100 is sealed only with the sealing film 41 having flexibility.

In the ink jet type recording head I of the embodiment, the ink is introduced from an ink introduction port which is connected to an external ink supply unit (not shown), and the inside from the manifold 100 to the nozzle opening 21 is filled with the ink. After that, a voltage is applied between the first electrode 60 and the second electrode 80 corresponding to the pressure generation chamber 12 according to a recording signal from the driving circuit. Accordingly, the vibrating plate 50 is deformed together with the piezoelectric element 300, the pressure in each pressure generation chamber 12 is increased, and ink droplets are ejected from each nozzle opening 21.

Here, a manufacturing method of the ink jet type recording head of the embodiment will be described. FIG. 7 to FIG. 21 are sectional views showing the manufacturing method of the ink jet type recording head.

Figure 7:
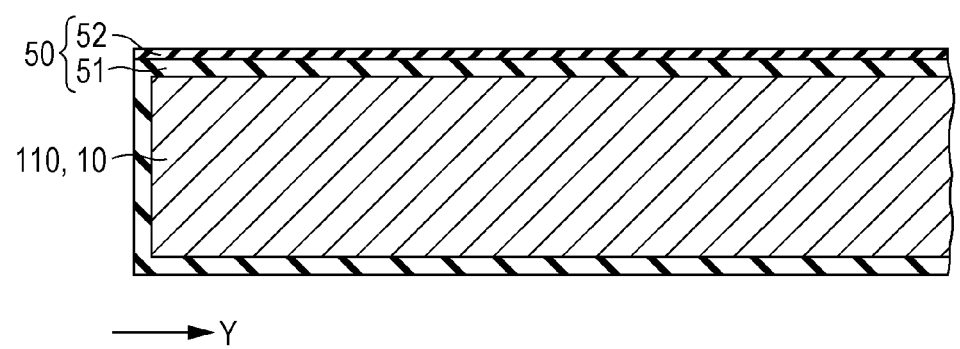
FIG. 7 is a sectional view showing a manufacturing method of the recording head according to Embodiment 1 of the invention.

First, as shown in FIG. 7, the vibrating plate 50 is formed on a surface of a flow path formation substrate wafer 110 which is a silicon wafer where the plurality of flow path formation substrates 10 are integrally formed. In this embodiment, the vibrating plate 50 which is formed of a stack of silicon dioxide (the elastic film 51) formed by performing thermal oxidation of the flow path formation substrate wafer 110 and zirconium oxide (the insulating film 52) formed by performing thermal oxidation, after forming a film by a sputtering method is formed.

Figure 8:
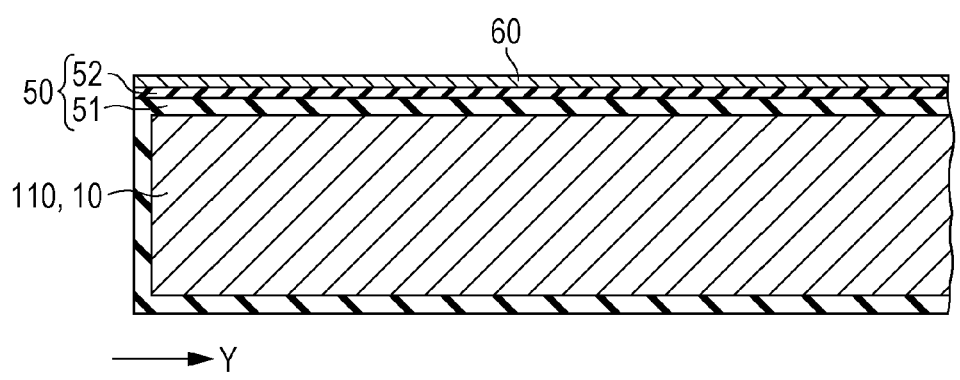
FIG. 8 is a sectional view showing a manufacturing method of the recording head according to Embodiment 1 of the invention.

Next, as shown in FIG. 8, the first electrode 60 is formed on the entire surface on the insulating film 52. The material of the first electrode 60 is not particularly limited, and for example, a material which is not oxidized even when heat temperature treatment is performed or which maintains conductivity even when being oxidized is preferable. A metal such as platinum or iridium, a conductive oxide such as iridium oxide or lanthanum nickel oxide, and a stacked material of these materials are preferably used. The first electrode 60 may be, for example, formed by using a gas phase method such as a sputtering method, a physical vapor deposition (PVD) method, or a laser ablation method, or a liquid phase method such as a spin coating method. An adhesive layer for ensuring adhesiveness may be used between the conductive material described above and the vibrating plate 50. In this embodiment, although not particularly shown, titanium is used as the adhesive layer. Zirconium, titanium, or titanium oxide may be used as the adhesive layer. A control layer for controlling crystal growth of the piezoelectric layer 70 may be formed on the surface of the electrode (side where the piezoelectric layer 70 is formed). In this embodiment, titanium is used for controlling crystals of the piezoelectric layer 70 (PZT). Since titanium is introduced into the piezoelectric layer 70 when forming the piezoelectric layer 70, titanium is not present as a film after forming the piezoelectric layer 70. As the crystal control layer, a conductive oxide having a perovskite type crystal structure such as lanthanum nickel oxide may be used.

Next, in this embodiment, the piezoelectric layer 70 formed of lead zirconate titanate (PZT) is formed. Here, in this embodiment, the piezoelectric layer 70 is formed by using a so-called sol-gel method which obtains the piezoelectric layer 70 formed of metal oxide by coating and drying a so-called sol which is obtained by dissolving and dispersing a metal complex in a solvent to convert into gel and baking the gel at a high temperature. The manufacturing method of the piezoelectric layer 70 is not limited to a sol-gel method, and a metal-organic decomposition (MOD) method, or a physical vapor deposition (PVD) method such as a sputtering method or a laser ablation method may be used, for example. That is, the piezoelectric layer 70 may be formed by using any of a liquid phase method and a gas phase method. In this embodiment, the piezoelectric layer 70 is formed by stacking a plurality of piezoelectric films 74.

Figure 9:
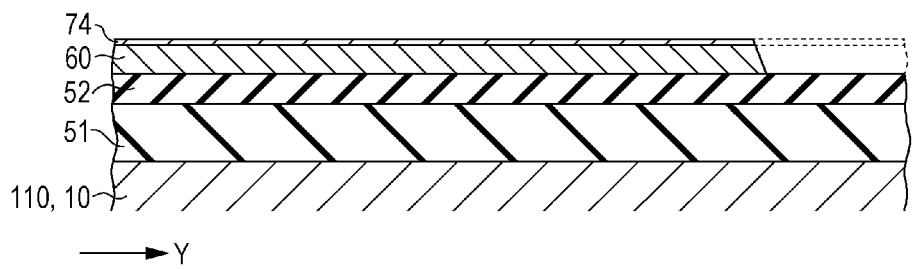
FIG. 9 is a sectional view showing a manufacturing method of the recording head according to Embodiment 1 of the invention.

Specifically, as shown in FIG. 9, the first electrode 60 and a first layer of the piezoelectric films 74 are patterned at the same time so that side surfaces thereof are tilted, at a stage where the first layer of the piezoelectric films 74 is formed on the first electrode 60. The patterning of the first electrode 60 and the first layer of the piezoelectric films 74 may be performed by performing dry etching such as reactive ion etching (RIE) or ion milling, for example.

Here, in a case of forming the first layer of the piezoelectric films 74 after patterning the first electrode 60, for example, since the first electrode 60 is patterned by performing a photolithography step, ion milling, and asking, the surface of the first electrode 60 or a crystal seed layer such as titanium (not shown) provided on the surface thereof may be altered. By doing so, even when the piezoelectric film 74 is formed on the altered surface, excellent crystal properties of the piezoelectric film 74 are not obtained, and since second and subsequent layers of the piezoelectric films 74 are also subjected to crystal growth by being affected by the crystal state of the first layer of the piezoelectric films 74, it is difficult to form the piezoelectric layer 70 having excellent crystal properties.

In comparison, when the first layer of the piezoelectric films 74 is formed and then patterned at the same time as the first electrode 60, the first layer of the piezoelectric films 74 has strong properties as a seed for excellent crystal growth of the second and subsequent layers of the piezoelectric film 74 compared to a crystal seed such as titanium, and crystal growth of the second and subsequent layers of the piezoelectric film 74 are not significantly affected, although an extremely thin altered layer is formed on the surface layer by patterning.

When forming the second and subsequent layers of the piezoelectric films 74 on the vibrating plate 50 (in this embodiment, the insulating film 52 which is zirconium oxide) exposed before forming the second layer of the piezoelectric films 74, a crystal control layer (intermediate crystal control layer) may be used. In this embodiment, titanium is used as the intermediate crystal control layer. The intermediate crystal control layer formed of titanium is introduced to the piezoelectric films 74 when forming the piezoelectric films 74, in the same manner as titanium of the crystal control layer formed on the first electrode 60. In addition, in a case where the intermediate crystal control layer becomes an intermediate electrode or a dielectric of a capacitor connected in series, the piezoelectric characteristics are decreased. Accordingly, it is desirable that the intermediate crystal control layer is introduced to the piezoelectric films 74 (piezoelectric layer 70) and does not remain as a film after forming the piezoelectric layer 70.

Figure 10:
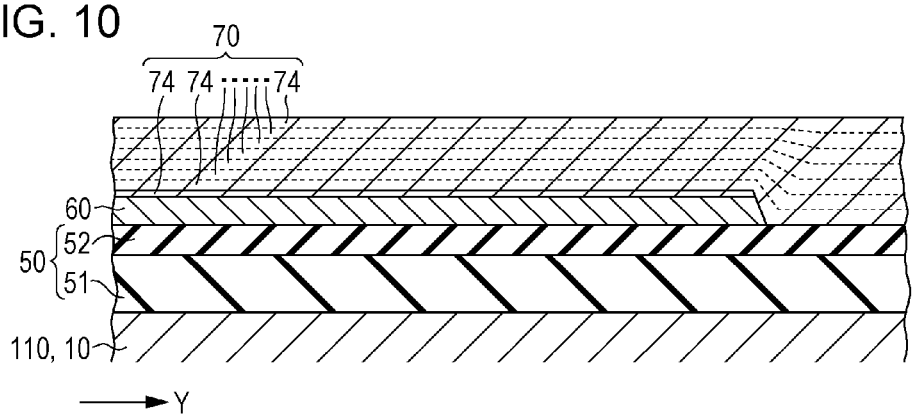
FIG. 10 is a sectional view showing a manufacturing method of the recording head according to Embodiment 1 of the invention.

Next, as shown in FIG. 10, the piezoelectric layer 70 formed of the plural layers of the piezoelectric films 74 is formed by stacking the second and subsequent layers of the piezoelectric films 74.

In addition, the second and subsequent layers of the piezoelectric films 74 are formed on the insulating film 52 in a continuous form, on the side surfaces of the first electrode 60 and the first layer of the piezoelectric film 74, and on the first layer of the piezoelectric film 74.

Figure 11:
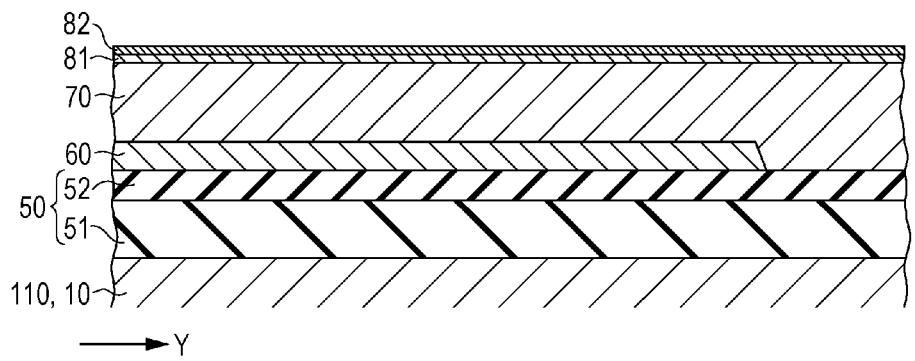
FIG. 11 is a sectional view showing a manufacturing method of the recording head according to Embodiment 1 of the invention.

Next, as shown in FIG. 11, the base layer 81 and the first layer 82 forming the second electrode 80 are stacked on the piezoelectric layer 70. In this embodiment, the base layer 81 formed of iridium oxide ($IrO_x$) and the first layer 82 formed of platinum (Pt) are stacked by using sputtering.

Figure 12:
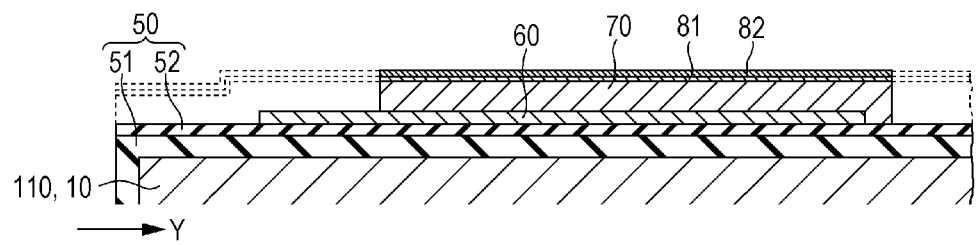
FIG. 12 is a sectional view showing a manufacturing method of the recording head according to Embodiment 1 of the invention.

Next, as shown in FIG. 12, the base layer 81, the first layer 82, and the piezoelectric layer 70 are patterned so as to correspond to each pressure generation chamber 12. In this embodiment, the patterning is performed by so-called photolithography for providing a mask (not shown) formed on the first layer 82 in a predetermined shape and etching the base layer 81, the first layer 82, and the piezoelectric layer 70 through this mask. In the patterning of the piezoelectric layer 70, dry etching such as reactive ion etching or ion milling is performed, for example. Accordingly, the piezoelectric layer 70 is patterned and the openings 71 (see FIG. 2) are formed.

Figure 13:
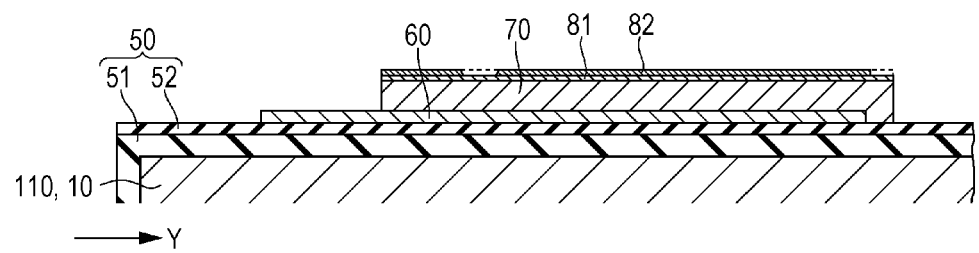
FIG. 13 is a sectional view showing a manufacturing method of the recording head according to Embodiment 1 of the invention.

Then, as shown in FIG. 13, only the first layer 82 is patterned in a shape shown in FIG. 4. In this embodiment, the patterning is performed by so-called photolithography for providing a mask (not shown) formed on the first layer 82 in a predetermined shape and etching only the first layer 82 through this mask. The patterning of the first layer 82 may be performed by using dry etching, for example.

After that, the piezoelectric layer 70 on which the first layer 82 is patterned is subjected to re-heating treatment (post annealing). By performing the re-heating treatment as described above, even when damage occurs when the base layer 81 and the first layer 82 are formed on the second electrode 80 side of the piezoelectric layer 70, it is possible to repair the damage to the piezoelectric layer 70 by performing the re-heating treatment and to improve the piezoelectric characteristics of the piezoelectric layer 70. Since the first layer 82 is formed of platinum, the first layer is not oxidized and contracted due to post annealing.

Figure 14:
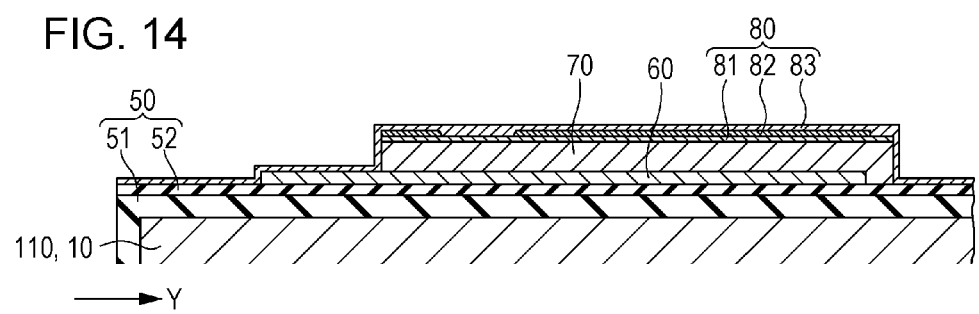
FIG. 14 is a sectional view showing a manufacturing method of the recording head according to Embodiment 1 of the invention.

Then, as shown in FIG. 14, the second electrode 80 is formed by forming the second layer 83 over one surface side (surface side on which the piezoelectric layer 70 is formed) of the flow path formation substrate wafer 110, that is, on the first layer 82, on the base layer 81, on the patterned side surface of the piezoelectric layer 70, on the insulating film 52, and on the first electrode 60. At this time, the second layer 83 in contact with the base layer 81 is oxidized and the oxidized portion 84 (see FIG. 5) is formed.

Figure 15:
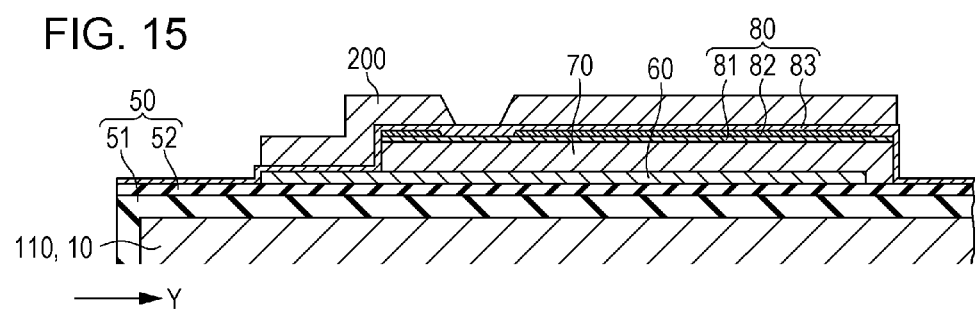
FIG. 15 is a sectional view showing a manufacturing method of the recording head according to Embodiment 1 of the invention.

Then, as shown in FIG. 15, a mask 200 formed of a resist having a predetermined shape is formed on the second electrode 80. In the mask 200, an opening is provided in a portion of the second electrode 80 where the removal portion 85 is formed, and an opening is provided in a portion where the second layer 83 is removed.

Next, as shown in FIG. 16, the second electrode 80 is patterned by etching the second electrode 80 through the mask 200. Accordingly, the removal portion 85 is formed. At this time, in the patterning of the second electrode 80, the base layer 81 and the second layer 83 are etched and the first layer 82 is not etched. That is, the second electrode 80 in which the first layer 82 is completely covered with the second layer 83 is formed.

Next, as shown in FIG. 17, the mask 200 is removed. In this embodiment, the mask 200 is removed by performing plasma treatment. In the removal of the mask 200 by performing plasma treatment, hydrogen or water is generated, but since the surface of the first layer 82 containing platinum is not exposed, it is possible to prevent platinum of the first layer 82 from becoming a catalyst. Accordingly, it is possible to prevent damage applied to the piezoelectric layer 70 due to platinum contained in the first layer 82 which becomes a catalyst to make hydrogen or water to react to become hydrogen ions.

Next, as shown in FIG. 18, after removing the mask 200, the lead electrode 90 is formed over the entire surface of one surface of the flow path formation substrate wafer 110. In this embodiment, the lead electrode 90 is formed by stacking the adhesive layer 191 and the conductive layer 192.

Next, as shown in FIG. 19, the lead electrode 90 is patterned in a predetermined shape. In the patterning of the lead electrode 90, the adhesive layer 191 may be patterned by wet etching, after patterning the conductive layer 192 first by wet etching.

Figure 20:
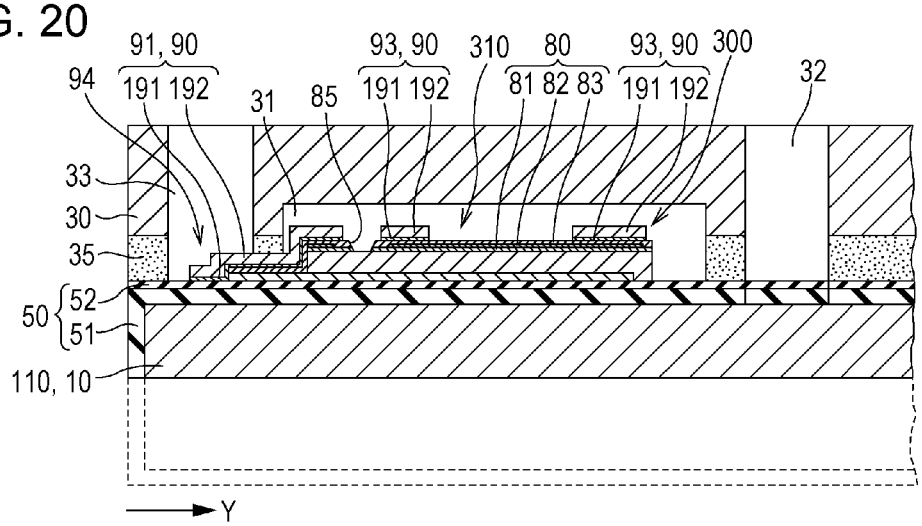
FIG. 20 is a sectional view showing a manufacturing method of the recording head according to Embodiment 1 of the invention.

Next, as shown in FIG. 20, a protection substrate wafer 130 which is a silicon wafer and is the plurality of protection substrates 30 is bonded to the piezoelectric element 300 side of the flow path formation substrate wafer 110 through the adhesive 35 and then the flow path formation substrate wafer 110 is set to be thin so as to have a predetermined thickness.

Figure 21:
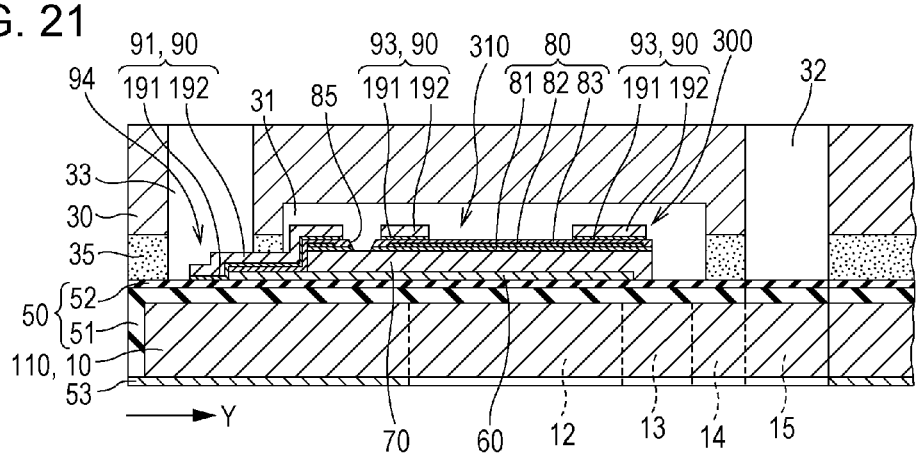
FIG. 21 is a sectional view showing a manufacturing method of the recording head according to Embodiment 1 of the invention.
Figure 22:
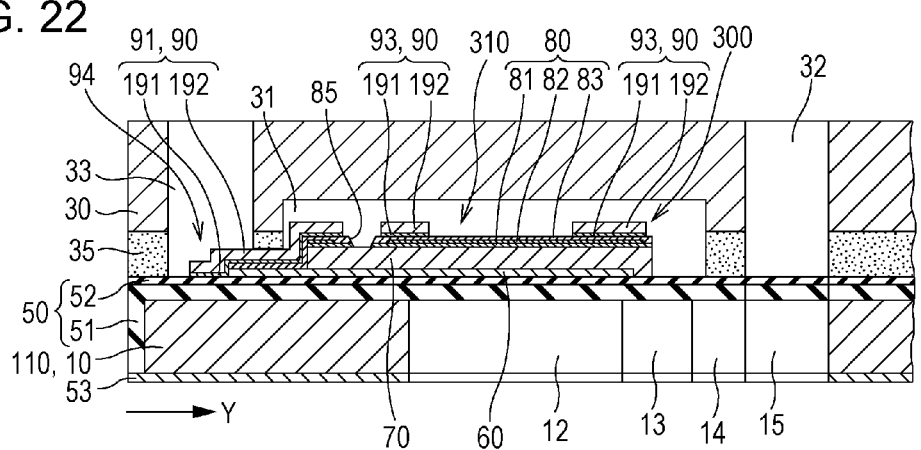
FIG. 22 is a sectional view showing a manufacturing method of the recording head according to Embodiment 1 of the invention.

Next, as shown in FIG. 21, a mask 53 newly formed on the flow path formation substrate wafer 110 and is patterned in a predetermined shape. Then, as shown in FIG. 22, the flow path formation substrate wafer 110 is subjected to anisotropic etching (wet etching) using an alkaline solution such as KOH through the mask 53, and accordingly the pressure generation chamber 12, the ink supply path 13, the communication path 14, and the communication portion 15 corresponding to the piezoelectric element 300 are formed. Hydrogen is generated in the etching of the silicon wafer by using KOH, but the piezoelectric element 300 is covered with the protection substrate wafer 130 and the first layer 82 containing platinum is covered with the second layer 83, even when hydrogen enters the inside of the piezoelectric element holding portion 31, accordingly, it is possible to prevent the first layer 82 operating as a catalyst and to prevent damage to the piezoelectric layer 70 due to hydrogen ions.

After that, unnecessary portions of outer periphery portions of the flow path formation substrate wafer 110 and the protection substrate wafer 130 are removed by cutting the portions by dicing or the like, for example. The nozzle plate 20 through which the nozzle openings 21 penetrate is bonded to the surface of the flow path formation substrate wafer 110 on a side opposite the protection substrate wafer 130, the compliance substrate 40 is bonded to the protection substrate wafer 130, and the flow path formation substrate wafer 110 and the like are divided into the flow path formation substrates 10 and the like, each of which are in one chip size as shown in FIG. 1, and therefore, the ink jet type recording head of the embodiment is obtained.

As described above, it is possible to perform post annealing of the piezoelectric layer 70 after forming the first layer 82 to improve the piezoelectric characteristics, by using the first layer 82 containing platinum, to prevent an increase in an electric resistance value of the first layer 82 by performing the post annealing, and to prevent a decrease in the strength of an electric field applied to the piezoelectric layer 70. Accordingly, it is possible to improve the piezoelectric characteristics of the piezoelectric layer 70 and to obtain high piezoelectric characteristics with a low voltage.

The end portion of the first layer 82 containing platinum of the second electrode 80 is covered with the second layer 83 so that the surface of the first layer 82 is not exposed, and accordingly, it is possible to prevent the operation of the first layer 82 as a catalyst, even when water or hydrogen is generated, after forming the second layer 83, and to prevent damage to the piezoelectric layer 70 due to hydrogen ions. Therefore, it is possible to improve the piezoelectric characteristics of the piezoelectric layer 70.

In addition, the portion of the second layer 83 contacted with the base layer 81 is set as the oxidized portion 84, and accordingly, it is possible to increase an electric resistance value of the end portion of the active portion 310 and to decrease an electric field applied to the piezoelectric layer 70 of the end portion of the active portion 310. Therefore, it is possible to prevent stress concentration in a boundary portion between the active portion 310 and the non-active portion and to prevent breakage of the piezoelectric layer 70.

Embodiment 2

Figure 23:
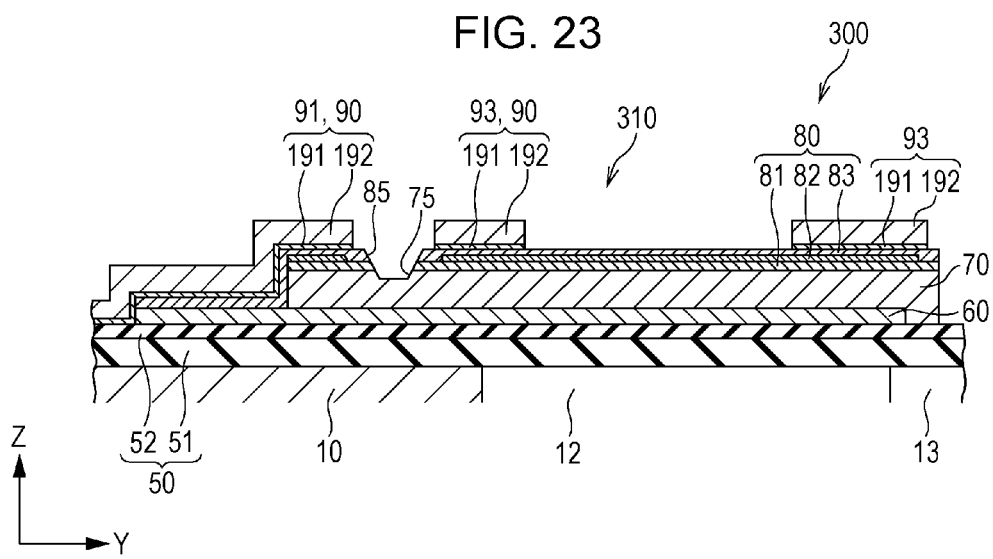
FIG. 23 is an enlarged sectional view of a main part of a recording head according to Embodiment 2 of the invention.
Figure 24:
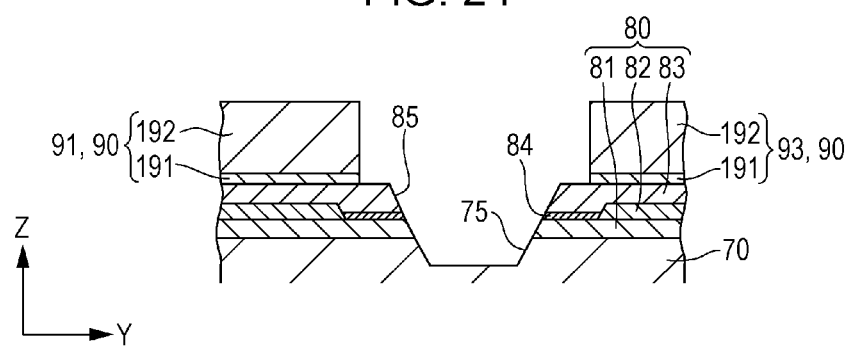
FIG. 24 is an enlarged sectional view of a main part of the recording head according to Embodiment 2 of the invention.

FIG. 23 and FIG. 24 are enlarged sectional views of a main part of an ink jet type recording head which is an example of a liquid ejecting head according to Embodiment 2 of the invention. The same reference numerals are used for the same members as in Embodiment 1 described above and overlapping description will be omitted.

As shown in the drawings, in this embodiment, in the second direction Y, the non-active portion of the piezoelectric layer 70 on the outer side of the active portion 310 has a smaller thickness in the third direction Z than the active portion 310. In this embodiment, a groove 75 that opens to the removal portion 85 is provided on the non-active portion of the piezoelectric layer 70 exposed by the removal portion 85, and accordingly, the thickness of the non-active portion is thinner than that of the active portion 310. The inner surface of the groove 75 is a tilted surface that continues to the end portion surface of the second electrode 80. The groove 75 of the piezoelectric layer 70 may be formed by over-etching a part of the piezoelectric layer 70, when etching the second electrode 80.

As described above, by setting the thickness of the piezoelectric layer 70 of the non-active portion that continues to the active portion 310 so as to be small, it is possible to prevent stress concentration, even in a case where a voltage is applied to the non-active portion from the second electrode 80 of the active portion 310.

Embodiment 3

Figure 25:
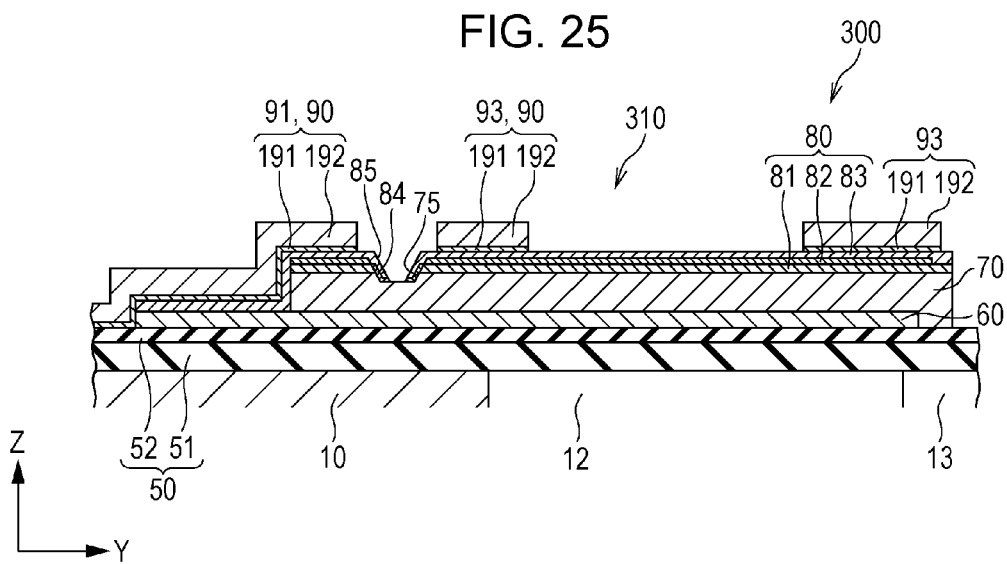
FIG. 25 is an enlarged sectional view of a main part of a recording head according to Embodiment 3 of the invention.
Figure 26:
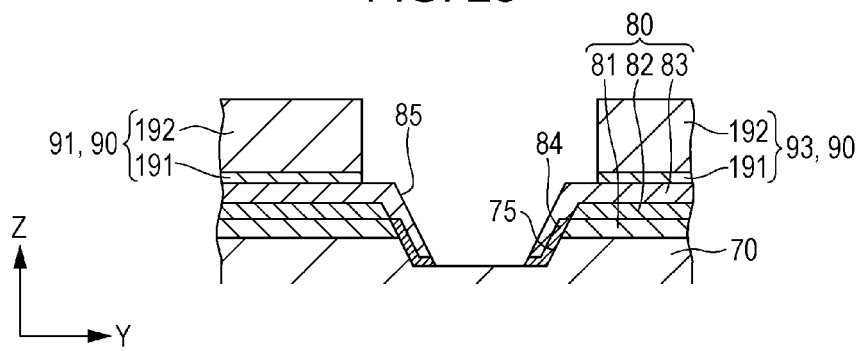
FIG. 26 is an enlarged sectional view of a main part of the recording head according to Embodiment 3 of the invention.

FIG. 25 and FIG. 26 are enlarged sectional views of a main part of an ink jet type recording head which is an example of a liquid ejecting head according to Embodiment 3 of the invention. The same reference numerals are used for the same members as in the embodiments described above and overlapping description will be omitted.

As shown in the drawings, in this embodiment, the groove 75 is provided on the piezoelectric layer 70, in the same manner as in Embodiment 2 described above.

The second layer 83 extends to the side surface of the groove 75. In the end portion where the removal portion 85 is provided, the first layer 82 is provided so as to have the same length as that of the base layer 81. With such a configuration, it is possible to cover the end portion of the first layer 82 with the second layer 83 and to cause the surface of the first layer 82 not to be exposed.

By extending the second layer 83 to the upper portion of the side surface of the groove 75, a portion where the base layer 81 and the piezoelectric layer 70 are in contact is the oxidized portion 84 which is oxidized by oxygen contained therein. Since the oxidized portion 84 is provided on the removal portion 85, that is, the end portion of the active portion 310, it is possible to increase an electric resistance value of the end portion of the active portion 310 and to decrease the strength of an electric field applied to the piezoelectric layer 70 in the end portion of the active portion 310. Accordingly, it is possible to prevent stress concentration in a boundary portion between the active portion 310 and the non-active portion and to prevent breakage of the piezoelectric layer 70.

Other Embodiments

Hereinabove, the embodiments of the invention have been described, but the basic configuration of the invention is not limited thereto.

For example, in Embodiments 1 to 3 described above, the piezoelectric layer 70 of the active portion 310 is continuously provided, but the piezoelectric layer 70 may be provided independently for each of the active portions 310. That is, the opening 71 is provided along the second direction Y and the piezoelectric layer 70 may be completely divided for each of the active portions 310. The opening 71 need not be provided on the piezoelectric layer 70.

In Embodiments 1 to 3 described above, the first electrode 60 is set as an individual electrode of a corresponding one of the active portions 310 and the second electrode 80 is set as a common electrode of the plurality of the active portions 310, but there is no particular limitation, and the first electrode 60 may be set as a common electrode and the second electrode 80 may be set as an individual electrode.

In Embodiments 1 to 3 described above, the pressure generation chambers 12 which are recesses are provided on the flow path formation substrate 10, which is a substrate, so as to penetrate the flow path formation substrate in the third direction Z, which is a thickness direction, but there is no particular limitation, and the pressure generation chambers 12 need not be provided so as to penetrate the flow path formation substrate 10 in the third direction Z, for example. That is, the pressure generation chambers 12 are provided so as to be open to the vibrating plate 50 side and the pressure generation chambers 12 and the nozzle openings 21 may penetrate through nozzle communication paths. The pressure generation chambers 12 are provided so as to be opened to the nozzle openings 21 side. A part of the flow path formation substrate 10 on the piezoelectric element 300 remains and the remaining part may be used as a part of the vibrating plate. That is, the recess includes a part penetrating a substrate such as the flow path formation substrate 10 in a thickness direction and a part that opens to any one surface.

Figure 27:
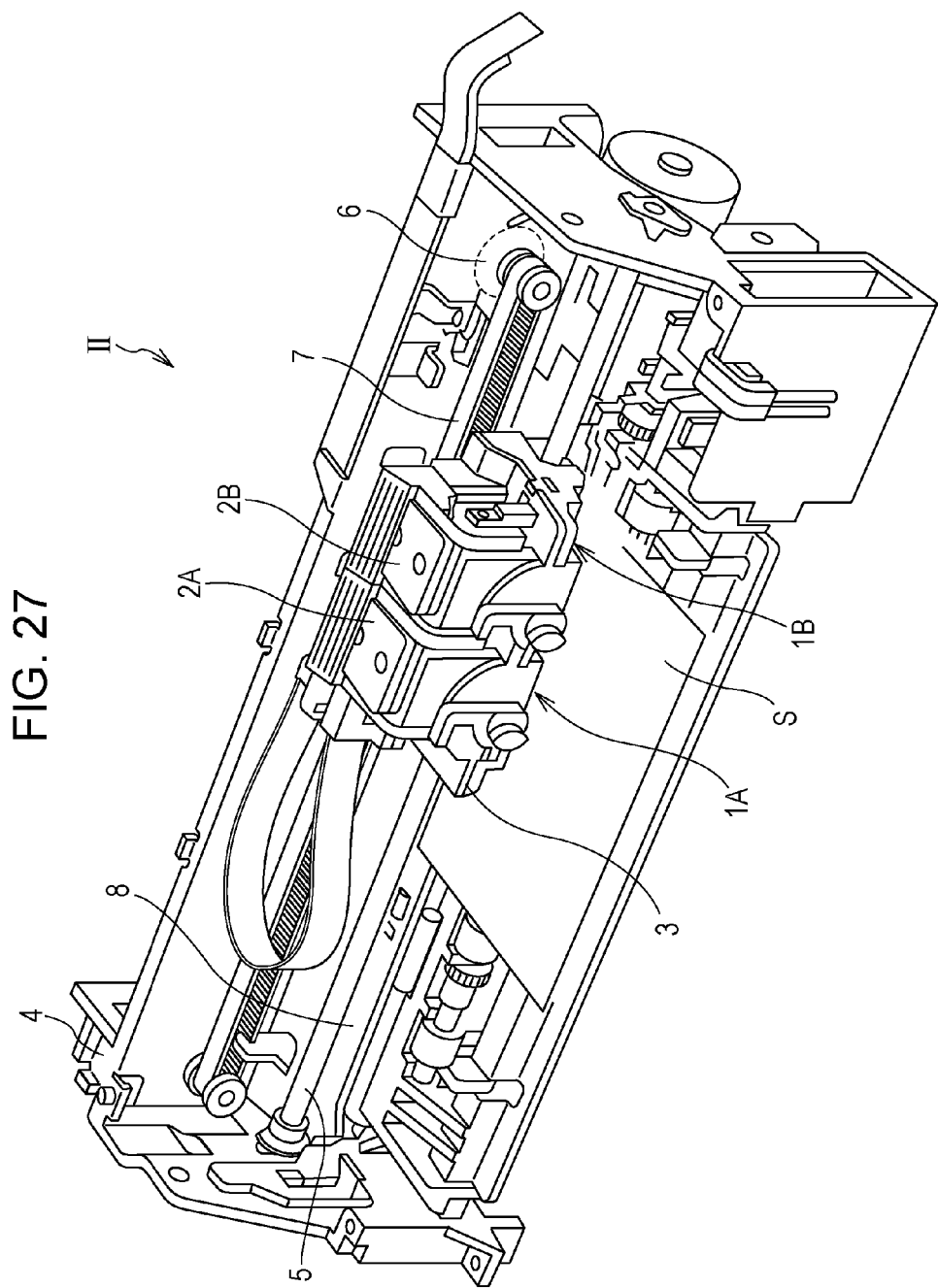
FIG. 27 is a schematic view showing a liquid ejecting apparatus according to one embodiment of the invention.

As shown in FIG. 27, the ink jet type recording head I is, for example, mounted on an ink jet type recording apparatus II.

As shown in FIG. 27, recording head units 1A and 1B including the ink jet type recording head I are provided so that cartridges 2A and 2B forming an ink supply unit are detachable, and a carriage 3 on which the recording head units 1A and 1B are mounted is provided on a carriage shaft 5 attached to an apparatus main body 4 so as to be movable in an axial direction. The recording head units 1A and 1B, for example, eject a black ink composition and a color ink composition.

A driving force of a driving motor 6 is transferred to the carriage 3 through a plurality of gear wheels (not shown) and a timing belt 7, and accordingly the carriage 3 on which the recording head units 1A and 1B are mounted is moved along the carriage shaft 5. Meanwhile, a transportation roller 8 as a transportation unit is provided on the apparatus main body 4 and a recording sheet S which is a recording medium such as paper is transported by the transportation roller 8. The transportation unit which transports the recording sheet S is not limited to the transportation roller and may be a belt or a drum.

In the examples described above, an apparatus in which the ink jet type recording head I is mounted on the carriage 3 and moves in a main scanning direction is used as the ink jet type recording apparatus II, but there is no particular limitation to this configuration. The ink jet type recording apparatus II may be, for example, a so-called line type recording apparatus in which the ink jet type recording head I is fixed and printing is performed by moving the recording sheet S such as paper in an auxiliary scanning direction.

In the examples described above, the ink jet type recording apparatus II has a configuration in which the cartridges 2A and 2B which are liquid storage units are mounted on the carriage 3, but there is no particular limitation. A liquid storage unit such as an ink tank may be fixed to the apparatus main body 4 and the liquid storage unit and the ink jet type recording head I may be connected to each other through a supply pipe such as a tube. In addition, the liquid storage unit need not be mounted on the ink jet type recording apparatus.

In the embodiments described above, the ink jet type recording head is used as an example of the liquid ejecting head and the ink jet type recording apparatus is used as an example of the liquid ejecting apparatus, but the invention is for general liquid ejecting heads and liquid ejecting apparatuses. The invention may also be applied to a liquid ejecting head or a liquid ejecting apparatus which ejects liquid other than ink. As other liquid ejecting heads, various recording heads used in an image recording apparatus such as a printer, a color material ejecting head used in manufacturing a color filter such as a liquid crystal display, an electrode material ejecting head used in electrode forming such as an organic EL display or a field emission display (FED), a bioorganic material ejecting head used in biochip manufacturing, and the like are used, for example and can be applied to the liquid ejecting apparatus including liquid ejecting head.

The invention can be also applied to other piezoelectric devices, without being limited to the piezoelectric element used in the liquid ejecting head. As other piezoelectric devices, an ultrasonic device such as an ultrasonic transmitter, an ultrasonic motor, or a piezoelectric transformer is used, for example. The invention can also be applied to a piezoelectric element used as a sensor. As a sensor using a piezoelectric element, an infrared sensor, an ultrasonic sensor, a thermosensitive sensor, a pressure sensor, and a pyroelectric sensor are used, for example.

The entire disclosure of Japanese Patent Application No. 2015-196209, filed Oct. 1, 2015 is expressly incorporated by reference herein in its entirety.

What is claimed is:

1. A piezoelectric element comprising:
a first electrode;
a piezoelectric layer located over the first electrode; and a second electrode located over the piezoelectric layer, wherein the second electrode comprises:
- a first layer having an upper surface, a lower surface, and a lateral surface extending from the upper surface to the lower surface,
- a second layer covering the upper surface and the lateral surface of the first layer, and
- a removal portion at which the piezoelectric layer is exposed from the first and second layers, wherein the second layer covers the upper surface of the first layer and covers the lateral surface of the first layer at the removal portion, and wherein the second layer does not contain platinum.

2. The piezoelectric element according to claim 1, wherein the first layer contains platinum.

3. A liquid ejecting head comprising:
the piezoelectric element according to claim 2.

4. A piezoelectric device comprising:
the piezoelectric element according to claim 2.

5. The piezoelectric element according to claim 1, wherein:
- the piezoelectric layer includes a plurality of active portions interposed between the first electrode and the second electrode,
- the first electrode includes a plurality of first electrode portions, each corresponding to a respective one of the active portions, and
- the second electrode is a common electrode for the plurality of active portions.

6. A liquid ejecting head comprising:
the piezoelectric element according to claim 5.

7. A piezoelectric device comprising:
the piezoelectric element according to claim 5.

8. The piezoelectric element according to claim 1, wherein the second electrode further comprises a base layer containing an oxide, the base layer being located between the first layer and the piezoelectric layer.

9. The piezoelectric element according to claim 8, wherein:
- an end portion of the base layer is in contact with a portion of the second layer, and
- the portion of the second layer in contact with the end portion of the base layer is oxidized.

10. A liquid ejecting head comprising:
the piezoelectric element according to claim 9.

11. A piezoelectric device comprising:
the piezoelectric element according to claim 9.

12. A liquid ejecting head comprising:
the piezoelectric element according to claim 8.

13. A piezoelectric device comprising:
the piezoelectric element according to claim 8.

14. The piezoelectric element according to claim 1, wherein the piezoelectric layer includes a groove opened to the lateral surface of the first layer, and
the second layer extends to a lateral surface of the groove.

15. The piezoelectric element according to claim 14, wherein a portion of the second layer in contact with the piezoelectric layer is oxidized.

16. A liquid ejecting head comprising:
the piezoelectric element according to claim 15.

17. A liquid ejecting head comprising:
the piezoelectric element according to claim 14.

18. A piezoelectric device comprising:
the piezoelectric element according to claim 14.

19. A liquid ejecting head comprising:
the piezoelectric element according to claim 1.

20. A piezoelectric device comprising:
the piezoelectric element according to claim 1.

* * * * *